(12) United States Patent
Kuzuma et al.

(10) Patent No.: US 6,965,853 B2
(45) Date of Patent: Nov. 15, 2005

(54) BACK ANNOTATION APPARATUS FOR CARRYING OUT A SIMULATION BASED ON THE EXTRACTION RESULT IN REGARD TO PARASITIC ELEMENTS

(75) Inventors: Hiroyuki Kuzuma, Hyogo (JP); Terutoshi Yamasaki, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 771 days.

(21) Appl. No.: 09/773,623

(22) Filed: Feb. 2, 2001

(65) Prior Publication Data

US 2002/0013688 A1    Jan. 31, 2002

(30) Foreign Application Priority Data

Jul. 27, 2000  (JP) .............................. 2000-226756

(51) Int. Cl.[7] .......................................... G06F 17/50
(52) U.S. Cl. .............................. 703/14; 716/11; 716/12
(58) Field of Search ........................... 716/5, 6, 10, 20, 716/1, 11, 12, 17, 19; 703/19, 14, 15

(56) References Cited

U.S. PATENT DOCUMENTS

| | | | | |
|---|---|---|---|---|
| 5,452,224 A | * | 9/1995 | Smith et al. ................. | 716/19 |
| 5,715,170 A | * | 2/1998 | Nakamori .................... | 703/19 |
| 5,717,928 A | * | 2/1998 | Campmas et al. ............ | 716/17 |
| 5,828,580 A | * | 10/1998 | Ho ............................... | 716/12 |
| 5,896,300 A | * | 4/1999 | Raghavan et al. ........... | 716/10 |
| 5,933,356 A | * | 8/1999 | Rostoker et al. ............. | 703/15 |
| 6,083,269 A | * | 7/2000 | Graef et al. .................. | 703/14 |
| 6,099,581 A | * | 8/2000 | Sakai ............................ | 716/11 |
| 6,286,126 B1 | * | 9/2001 | Raghavan et al. ........... | 716/6 |
| 6,317,860 B1 | * | 11/2001 | Heile ............................ | 716/5 |

FOREIGN PATENT DOCUMENTS

| | | |
|---|---|---|
| JP | 3-257586 | 11/1991 |
| JP | 6-243190 | 9/1994 |
| JP | 9-16649 | 1/1997 |

OTHER PUBLICATIONS

Mc Connell et al., Software tool to allow field programmable system level device, Dec. 6, 2001, US Pub. No. 0049593.*

Li et al., T. Layout Extraction and Verification Methodology CMOS I/O Circuits, Proceedings of the 35th Annual Conference on Design Automation, May 1998, pp. 291-296.*

* cited by examiner

*Primary Examiner*—Russell Frejd
(74) *Attorney, Agent, or Firm*—McDermott Will & Emery LLP (57) ABSTRACT

A back annotation apparatus, which effectively carries out a back annotation, includes: a pre-layout simulation implementing part for detecting nodes of which the potential changes when a predetermined signal is applied to a logic circuit; a layout pattern verification implementing part for implementing a predetermined layout pattern verification for layout patterns of the logical circuit; a parasitic element extraction part connected to the pre-layout simulation implementing part which extracts parasitic elements from the nodes of which the potential changes; a net list generation part connected to the parasitic element extraction part for generating a net list which includes all the devices included in the layout pattern data and parasitic elements extracted in the parasitic element extraction part; and a post layout simulation implementing part connected to the net list generation part for implementing a post layout simulation by using the net list.

10 Claims, 12 Drawing Sheets

★ ACTIVE NODES DETECTED AT THE PRE-LAYOUT SIMULATION

S11 — PRE-LAYOUT SIMULATION (EXTRACTION OF ACTIVE NODE AND NON-ACTIVE NODE INFORMATION)

S2 — LAYOUT PATTERN VERIFICATION

S12 — EXTRACTION OF THE INTERNAL NODES WHEREIN PARALLELLY CONNECTED DEVICES, DEGENERATED AT THE LAYOUT PATTERN VERIFICATION CORRESPONDING TO THE ACTIVE NODES/NON-ACTVE NODES ARE CONNECTED IN SERIES

S13 — EXTRACTION OF THE INTERNAL NODES OF SERIALLY CONNECTED DEVICES DEGENERATED AT THE LAYOUT PATTERN VERIFICATION CORRESPONDING TO THE ACTIVE NODES/NON-ACTIVE NODES

S14 — UPDATE OF THE ACTIVE NODE/NON-ACTIVE NODE INFORMATION THROUGH THE USAGE OF THE INTERNAL NODE INFORMATION EXTRACTED IN S12 AND S13.

S15 — PASS SELECTION TYPE PARASITIC ELEMENT EXTRACTION THROUGH THE USAGE OF A PARASITIC ELEMENT EXTRACTION TOOL AND NET LIST GENERATION OF A PARTIAL CIRCUIT WITH PARASITIC ELEMENTS

S16 — DEGENERATION OF SOLELY THE PARASITIC ELEMENT INFORMATION WITHIN THE NET LIST WITH PARASITIC ELEMENTS THROUGH THE USAGE OF A PARASITIC ELEMENT DEGENERATION TOOL

S17 — POST-LAYOUT SIMULATION IMPLEMENTATION

★ACTIVE NODES DETECTED AT THE PRE-LAYOUT SIMULATION

FIG.7C  (ACTIVE NODE INFORMATION)

| A,D,E,F,G | — ea7 |

FIG.7D  (NON-ACTIVE NODE INFORMATION)

| C  3.0V | — ea8 |

★ACTIVE NODES DETECTED AT THE PRE-LAYOUT SIMULATION (ACTIVE NODE INFORMATION)

FIG.12B (ACTIVE NODE INFORMATION)

A,D,E,F,G  — ea7

(ADDITIONAL NON-ACTIVE NODE INFORMATION)

```
R1_1   A#2   A#3   2.0
R1_2   A#3   A#4   3.0
R1_3   A#4   A#5   1.0
R1_4   A#3   A#5   4.0
R1_5   A#5   A#6   1.0
C1_1   A#2   GND   0.1PF
C1_2   A#3   GND   0.2PF
C1_3   A#4   GND   0.2PF
C1_4   A#5   GND   0.2PF
C1_5   A#6   GND   0.1PF
```

FIG.12D

```
RAA1   A#2   A#6   5.0
CAA1   A#2   GND   0.4PF
CAA2   A#6   GND   0.4PF
```
— e6

BACK ANNOTATION APPARATUS FOR CARRYING OUT A SIMULATION BASED ON THE EXTRACTION RESULT IN REGARD TO PARASITIC ELEMENTS

BACKGROUND OF THE INVENTION

1. Field of the Invention

The present invention relates to a back annotation apparatus and method thereof, and more particularly, to an apparatus and a method thereof for carrying out a simulation based on the extraction result in regard to extracted parasitic elements.

2. Description of the Background Art

As processing technologies have progressed and electronic elements have become faster it has become important to eliminate wiring delays. Therefore, after layout is completed, parasitic elements which cause wiring delays are extracted from the layout and, then, a circuit simulation is carried out by using a circuit configuration of the layout and the information of the above described parasitic elements. This is called a back annotation.

In a conventional back annotation flow, a net list with parasitic elements including parasitic element information about all the devices existing within the target layout pattern data and designated nodes is used to carry out a post layout simulation.

Semiconductor integrated circuits, however, have become large scaled in recent years. Accordingly, the time required for parasitic element extraction and post layout simulation becomes large for carrying out a post layout simulation with all of the devices of a semiconductor integrated circuit as targets and, therefore, in many cases implementation in real time is difficult. In addition, work for selecting target nodes of parasitic element extraction within the target layout pattern data have been carried out manually, and therefore has been difficult. Moreover, there is a problem that the more the number of extraction target nodes are, the more difficult the post layout simulation becomes.

SUMMARY OF THE INVENTION

The present invention is provided to solve the above described problem and the purpose thereof is to provide a back annotation apparatus and method thereof which make the implementation of effective back annotation possible.

A back annotation apparatus according to one aspect of the present invention includes: a pre-layout simulation implementing part for detecting nodes of which the potential changes when a predetermined signal is applied to a logic circuit; a layout pattern verification implementing part for implementing a predetermined layout pattern verification for layout patterns of the logical circuit; a parasitic element extraction part connected to the pre-layout simulation implementing part which extracts parasitic elements from the nodes of which the potential changes; a net list generation part connected to the parasitic element extraction part for generating a net list which includes all the devices included in layout pattern data and parasitic elements extracted in the parasitic element extraction part; and a post layout simulation implementing part connected to the net list generation part for implementing a post layout simulation by using the net list.

The selection of target nodes of the parasitic element extraction within the target layout pattern data is facilitated by using the result of the pre-layout simulation. Accordingly, the extraction processing time of the parasitic elements is shortened. In addition, the post layout simulation is carried out by using the extraction result of the parasitic elements. Therefore, the implementation of an effective back annotation becomes possible while shortening the processing time of the post layout simulation.

The pre-layout simulation implementing part preferably includes an active node detection part for detecting nodes of which the potential changes when a predetermined signal is applied to the logic circuit and a non active node detection part for detecting nodes of which the potential does not change when the predetermined signal is applied to a logic circuit. The net list generation part includes a net list generation part with parasitic elements which is connected to the parasitic element extraction part and the layout pattern verification implementing part and which generates a net list including parasitic elements to the active nodes within layout pattern data and devices connected to the active nodes. The post layout simulation implementing part includes a circuit which is connected to the net list generation part and the non active node detection part, which fixes the potential of the node, of which the potential does not change, at a predetermined potential and which implements out a post layout simulation by using the net list.

The back annotation apparatus more preferably further includes: the first internal node extraction part for extracting layout pattern data or nodes of the logic circuit diagram which is connected to the layout pattern verification implementing part and to which serially connected devices degenerated according to a predetermined standard at the time of layout pattern verification are connected in parallel; the second internal node extraction part for extracting layout pattern data or nodes of logic circuit diagram which is connected to the layout pattern verification implementing part and wherein serially connected elements degenerated according to a predetermined standard at the time of layout pattern verification are made to be a single element; a node information updating part for updating the detection result of the active node detection part and the non active node detection part based on the extraction result at the first and the second internal node extraction parts, which is connected to the first internal node extraction part, the second internal node extraction part, the active node detection part and the non active node detection part; and a parasitic element information degenerating part for degenerating only the parasitic element information included in the net list which is connected to the net list with parasitic elements.

The target node selection of the parasitic element extraction within the layout pattern data using the pre-layout simulation is made easier. Accordingly, narrowing down the post layout simulation target circuits, parasitic element extraction following the layout pattern data and degeneration of parasitic element information while maintaining the extraction precision can be implemented. In addition, the parasitic element extraction processing time and the post layout simulation processing time using the above described parasitic element extraction result are shortened so as to make possible the implementation of an effective back annotation.

A back annotation method according to another aspect of the present invention includes: the step of detecting nodes of which the potential changes when a predetermined signal is applied to a logic circuit; the step of implementing a predetermined layout pattern verification with respect to a layout pattern of the logic circuit; the step of extracting parasitic elements from the nodes of which the potential changes; the step of generating a net list including all the devices included in the layout pattern data and the parasitic elements extracted by the parasitic element extraction part; and the step of implementation of a post layout simulation by using the net list.

The selection of target nodes of the parasitic element extraction within the target layout pattern data is facilitated by using the result of the pre-layout simulation. Accordingly, the extraction processing time of the parasitic elements is shortened. In addition, the post layout simulation is carried out by using the extraction result of the parasitic elements. Therefore, the implementation of an effective back annotation becomes possible while shortening the processing time of the post layout simulation.

The foregoing and other objects, features, aspects and advantages of the present invention will become more apparent from the following detailed description of the present invention when taken in conjunction with the accompanying drawing.

BRIEF DESCRIPTION OF THE DRAWINGS

FIGS. 8A to 9B are diagrams for describing the detail of processing in S12 of FIG. 6;

FIGS. 10A to 11 show diagrams for describing the detail of processing in S13 of FIG. 6.

DESCRIPTION OF THE PREFERRED EMBODIMENTS

Figure 1:
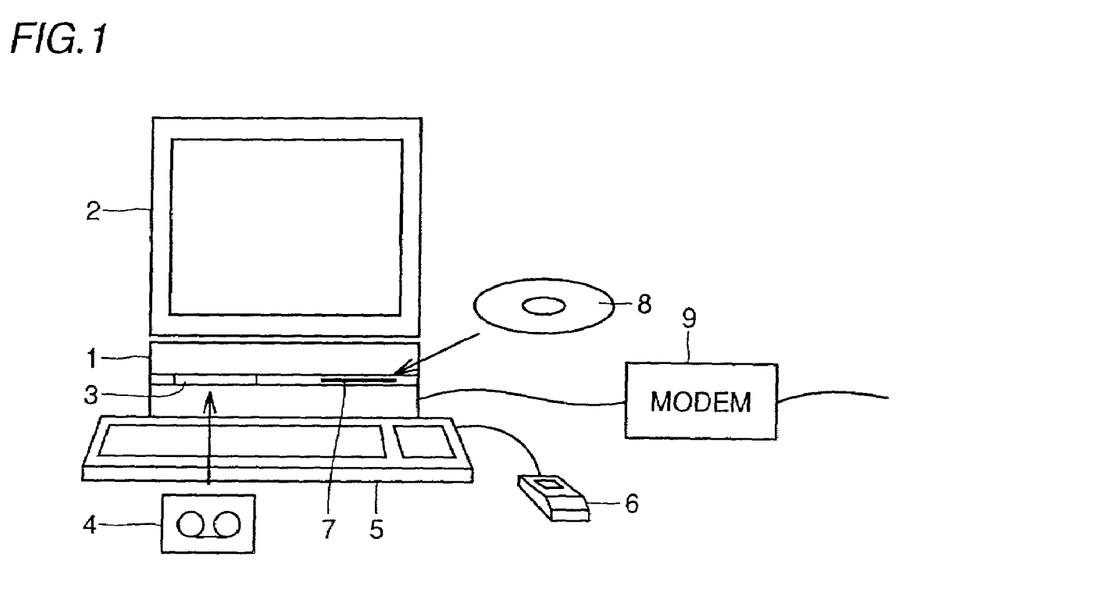
FIG. 1 is an external view of a back annotation apparatus according to the first and the second embodiments of the present invention.

Referring to FIG. 1 a back annotation apparatus includes a computer 1, a keyboard 5 and a mouse 6 for giving instructions to the computer 1, a display 2 for displaying the results or the like of the operation by the computer 1, a magnetic tape apparatus 3, a CD-ROM (Compact Disc-Read Only Memory) apparatus 7 and a communication modem 9 for reading out, respectively, the programs executed by the computer 1.

The program of the back annotation flow is recorded on the magnetic tape 4 or the CD-ROM 8 which are recording media that are readable by the computer 1 so as to be read out, respectively, by the magnetic tape apparatus 3 and the CD-ROM apparatus 7. Or, they can be read out by the communication modem 9 via the communication line.

Figure 2:
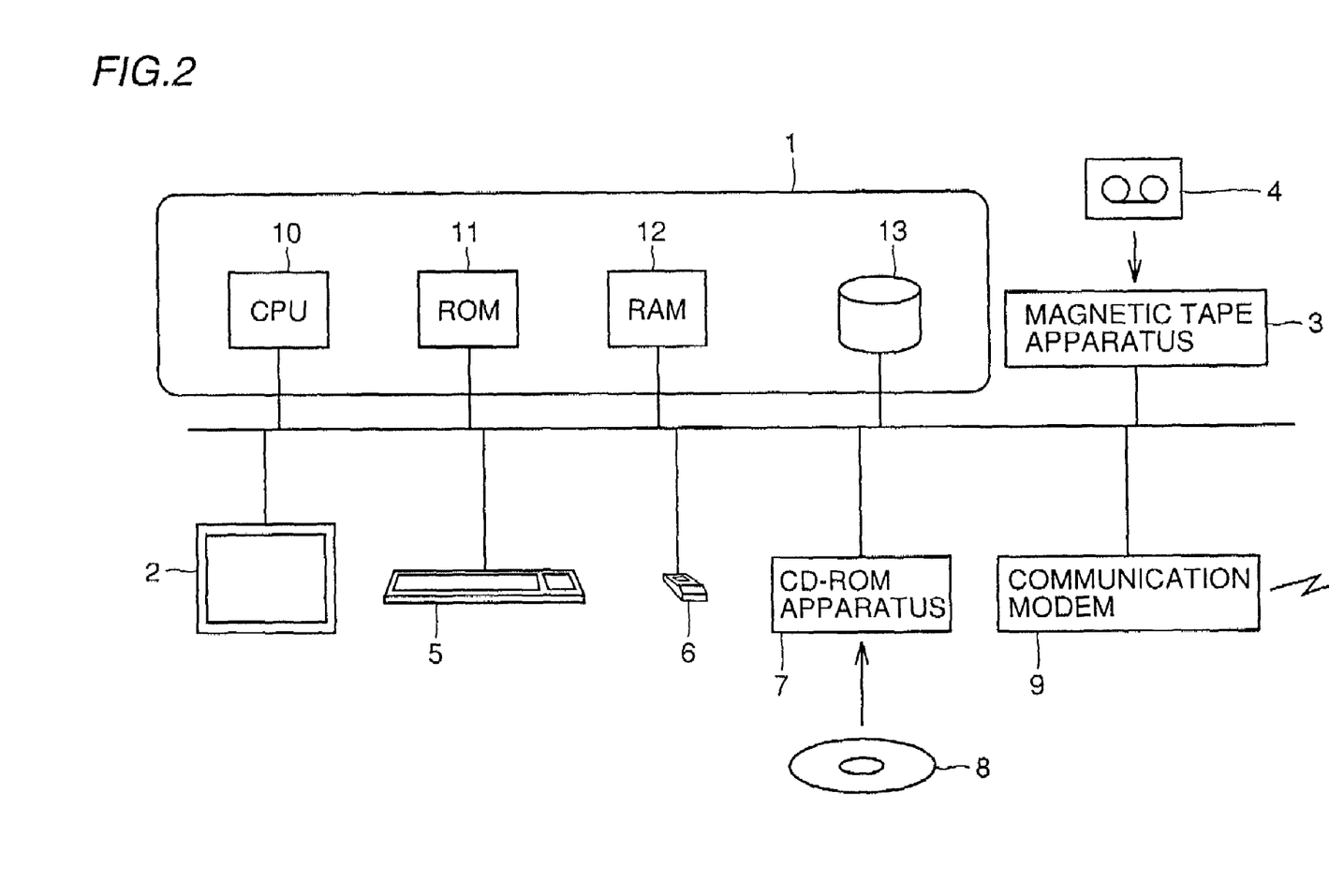
FIG. 2 is a block diagram showing a hardware configuration of a back annotation apparatus according to the first and the second embodiments of the present invention.

Referring to FIG. 2, the computer 1 includes a CPU (Central Processing Unit) 10 for executing the programs read out by the magnetic tape apparatus 3, by the CD-ROM apparatus 7 or through the communication modem 9, a ROM (Read Only Memory) 11 for storing other programs or data required for the operation of the computer 1, a RAM (Random Access Memory) 12 for storing the programs, parameters at the time of executing the programs, operation results or the like and a magnetic disc 13 for storing programs or data.

The programs read out by the magnetic tape apparatus 3, by the CD-ROM apparatus 7 or through the communication modem 9 are implemented by the CPU 10 so as to implement the back annotation flow.

Figure 3:
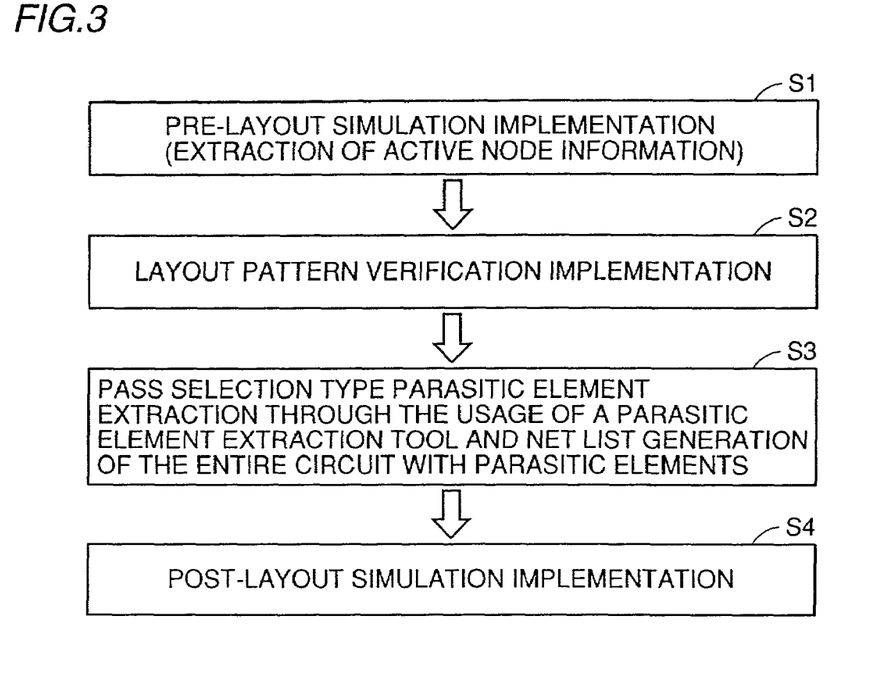
FIG. 3 is a flowchart of back annotation processing according to the first embodiment.

Referring to FIG. 3, the back annotation flow according to the present embodiment will be described.

Figure 4A:
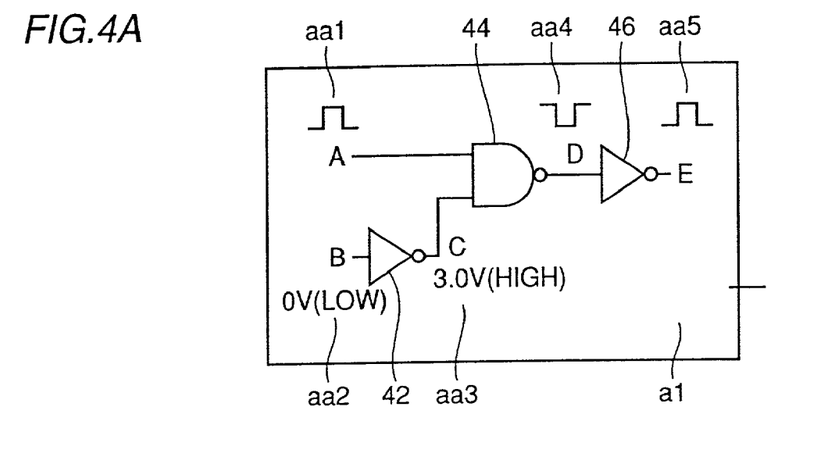
FIGS. 4A to 4C are diagrams for describing an active node extraction method when a pre-layout simulation is carried out on the logic circuit diagram.

A logic circuit diagram a1 as shown in FIG. 4 includes an inverter 42 connected to an input node B, a NAND gate 44 connected to the input node A and to an output node C of the inverter 42, and an inverter 46 connected to an output node D of the NAND gate 44.

Figure 4B:
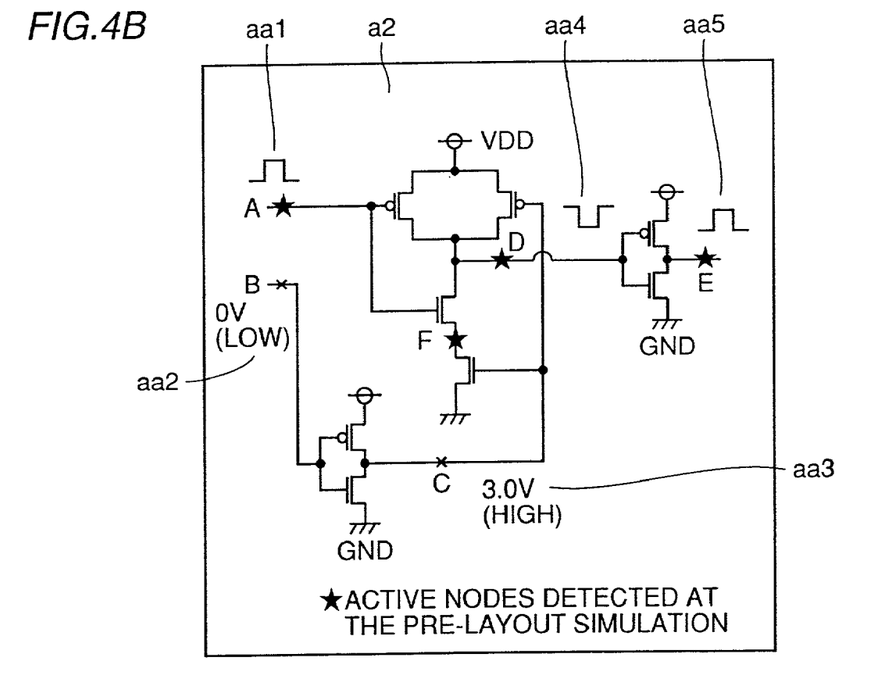

A pre-layout simulation is carried out in the logic circuit diagram a1 so as to extract a node (hereinafter referred to as an "active node") wherein the potential varies at the time of implementation of the simulation (S1). FIG. 4B is a diagram gained by a pre-layout simulation in the logic circuit diagram a1 of FIG. 4A.

Figure 4C:
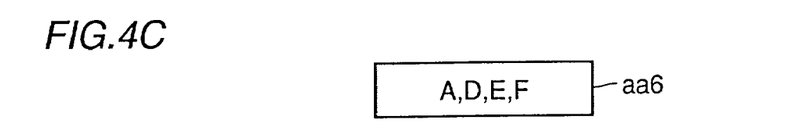

As shown in FIG. 4B, if an input signal aa1 is inputted to the input node A and an input signal aa2 (0 V) is inputted to the input node B, a signal aa3 (3.0 V) is outputted to an input and output node C, an output signal aa4 is outputted to an input and output node D and an output signal aa5 is outputted to an output node E, respectively, at the time of pre-layout simulation. At the same time, nodes A, D, E and F are extracted as active nodes of which the potential varies at the time of pre-layout simulation and active node information aa6 is outputted as shown in FIG. 4C.

Figure 5A:
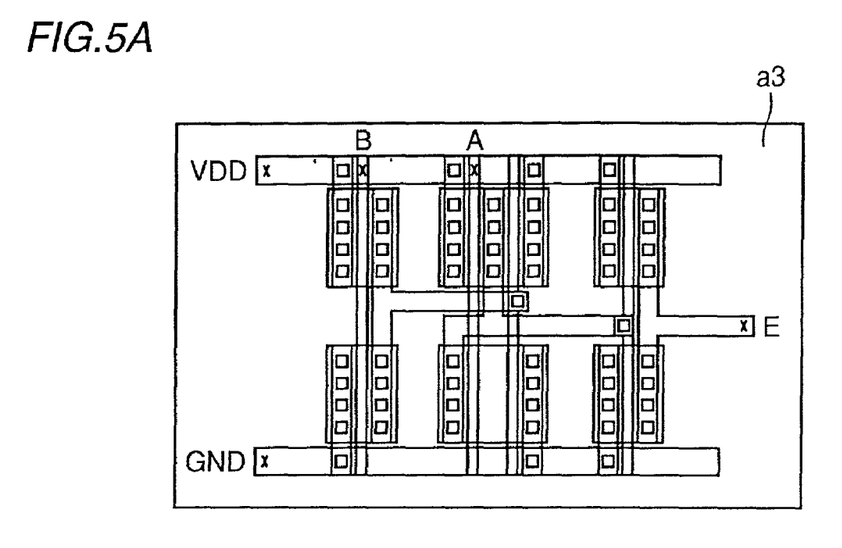
FIGS. 5A and 5B are diagrams for describing an example of extraction of parasitic elements from the layout pattern data.
Figure 5B:
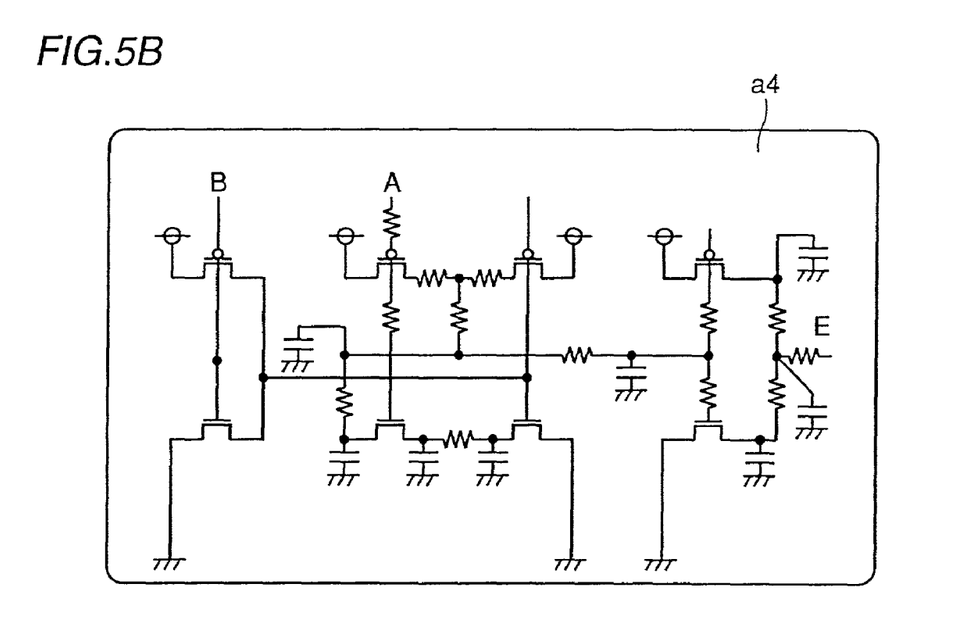

A layout pattern verification is carried out for layout pattern data a3 as shown in FIG. 5A (S2) according to the same method as in a prior art.

Based on active node information aa6 extracted at the time of pre-layout simulation of S1, parasitic elements are extracted from the layout pattern data a3 so as to generate a net list with parasitic elements including information about all of the devices of layout pattern data a3 and extracted parasitic elements (S3).

After that, a post-layout simulation is carried out by using the net list with parasitic elements generated in S3 (S4).

As described above, according to the first Embodiment, the selection of target nodes of the parasitic element extraction within the layout pattern data is facilitated by using the result of pre-layout simulation. Accordingly, the extraction processing time of the parasitic elements is shortened. In addition, the post layout simulation is carried out by using the extraction result of the parasitic elements. Therefore, the implementation of an effective back annotation becomes possible while shortening the processing time of the post layout simulation.

Second Embodiment

A back annotation apparatus according to the present embodiment has the same hardware structure as in the first embodiment. Therefore, the detailed description thereof is not repeated herein.

Figure 6:
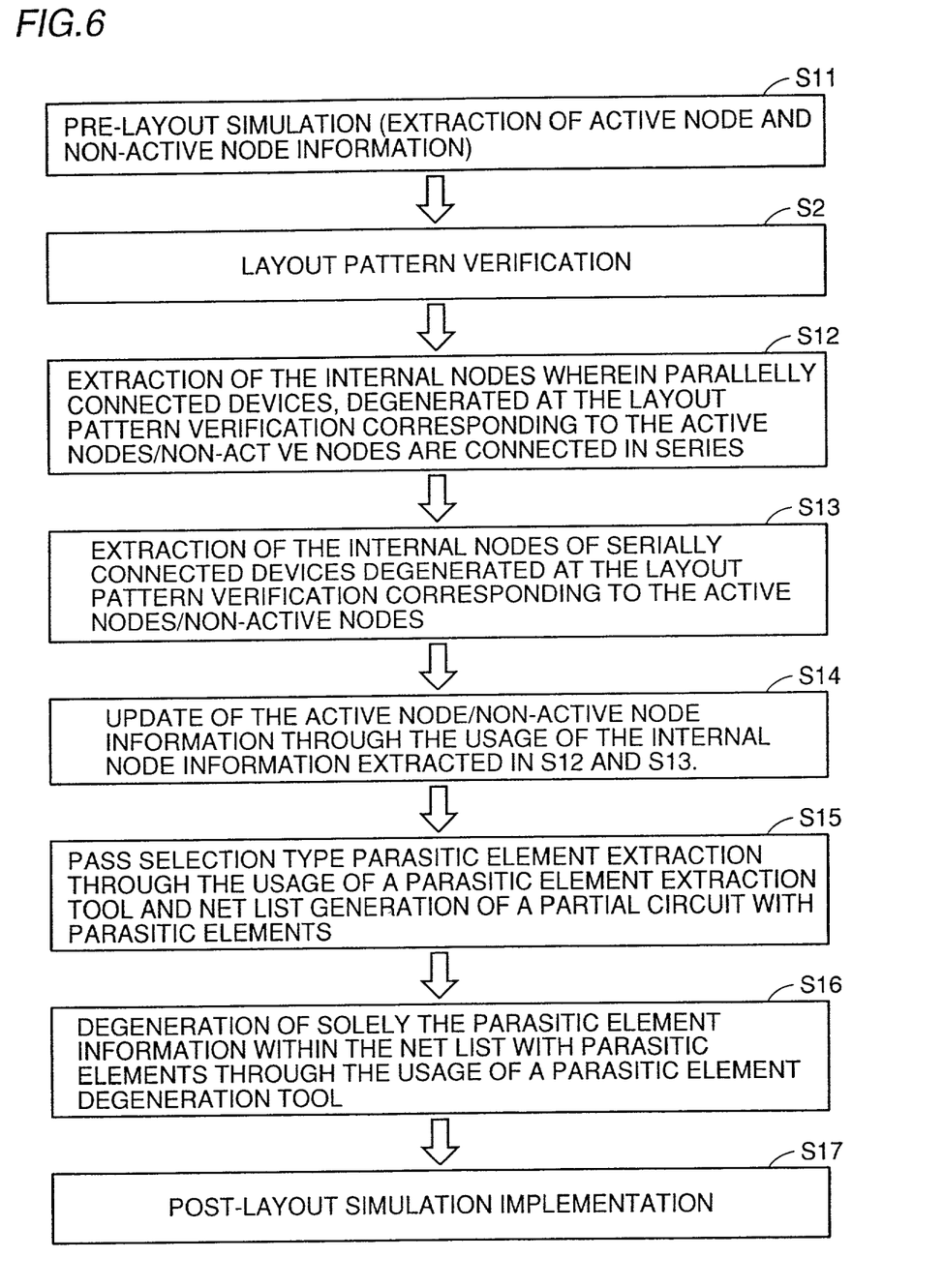
FIG. 6 is a flowchart of back annotation processing according to the second embodiment.

A back annotation flow according to the present embodiment will be described in referring to FIG. 6.

Figure 7A:
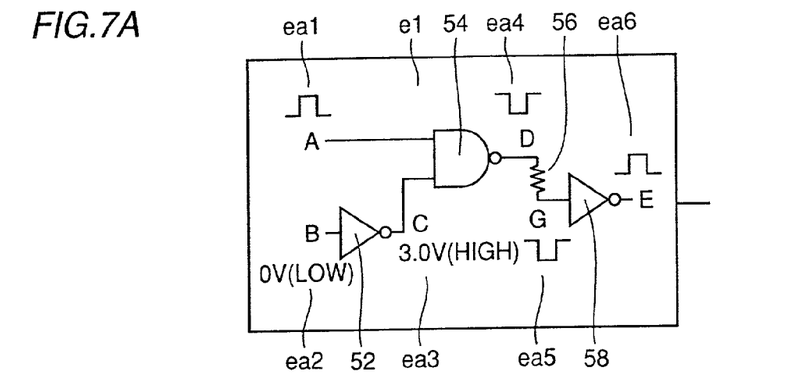
FIGS. 7A to 7D are diagrams for describing an active node/non active node extraction method when a pre-layout simulation is carried out on the logic circuit diagram.

A logic circuit diagram e1 as shown in FIG. 7A includes: an inverter 52 connected to an input node B; a NAND gate 54 connected to an input node A and an output node C of the inverter 52; a resistor 56 connected to an output node D of the NAND gate 54; and an inverter 58 connected to an input and output node G located on the opposite side of the output node D of the register 56.

A pre-layout simulation is carried out in the logic circuit diagram e1 as shown in FIG. 4A so as to extract an active node and a node of which the potential does not change (hereinafter referred to as a "non-active node") at the time of the simulation (S11).

Figure 7B:
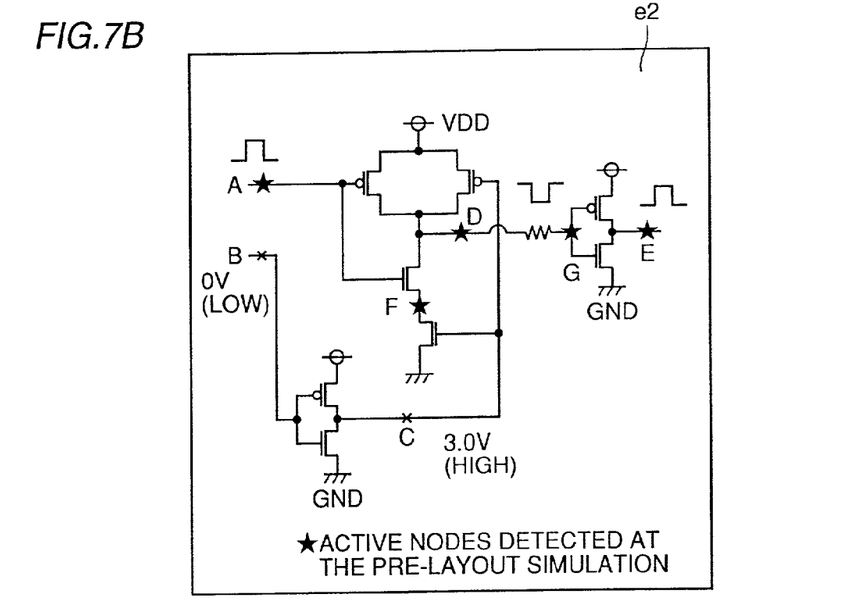
Figure 7C:
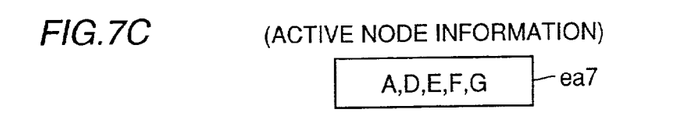
Figure 7D:
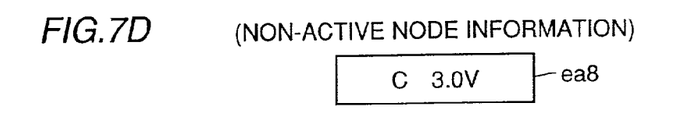

As shown in FIG. 7B, if an input signal ea1 is inputted to the input node A and an input signal ea2 (0 V) is inputted to the input node B, a signal ea3 (3.0 V) is outputted to the input and output node C, an output signal ea4 is outputted to the input and output node D, an output signal ea5 is outputted to the input and output node G and an output signal ea6 is outputted to the output node E, respectively, at the time of pre-layout simulation. At the same time, nodes A, D, E, F and G are extracted as active nodes of which the potential changes at the time of pre-layout simulation and active node information ea7 is outputted as shown in FIG. 7C. In addition, the node C and its fixed potential (3.0 V) are extracted as a non-active node of which the potential did not change so as to be outputted as non-active node information ea8 as shown in FIG. 7D (S11).

A layout pattern verification is carried out for the layout pattern as shown in FIG. 7B in accordance with the same method as in a prior art (S2).

If the nodes in layout pattern data corresponding to the active node/non-active node extracted at the time of pre-layout simulation are the internal nodes of the serially connected devices which are degenerated according to a pre-determined standard and which are connected in parallel (e.g. parallelly connected elements connected in series to form a single element), all of the internal nodes on the degenerated layout pattern data (internal nodes before degeneration) are extracted (S12).

In addition, at the same time, in S12, if the nodes in logic circuit diagram data corresponding to the above described active nodes/non-active nodes are the internal nodes of the serially connected devices which are degenerated according to the predetermined standard and which are connected in parallel at the time of a layout pattern verification, the internal nodes in the layout pattern data corresponding to the internal nodes in the logic circuit diagram are extracted.

Figure 8A:
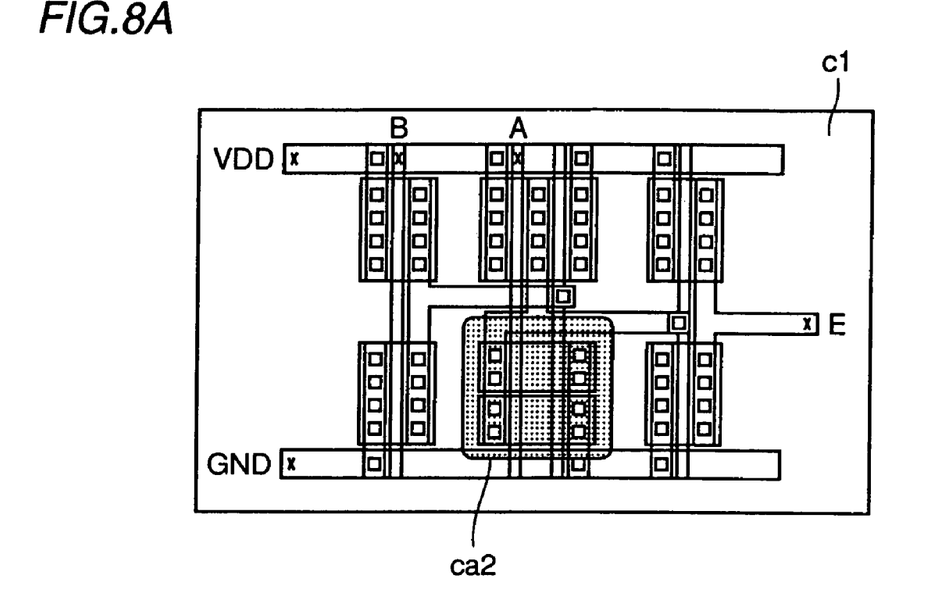
Figure 8B:
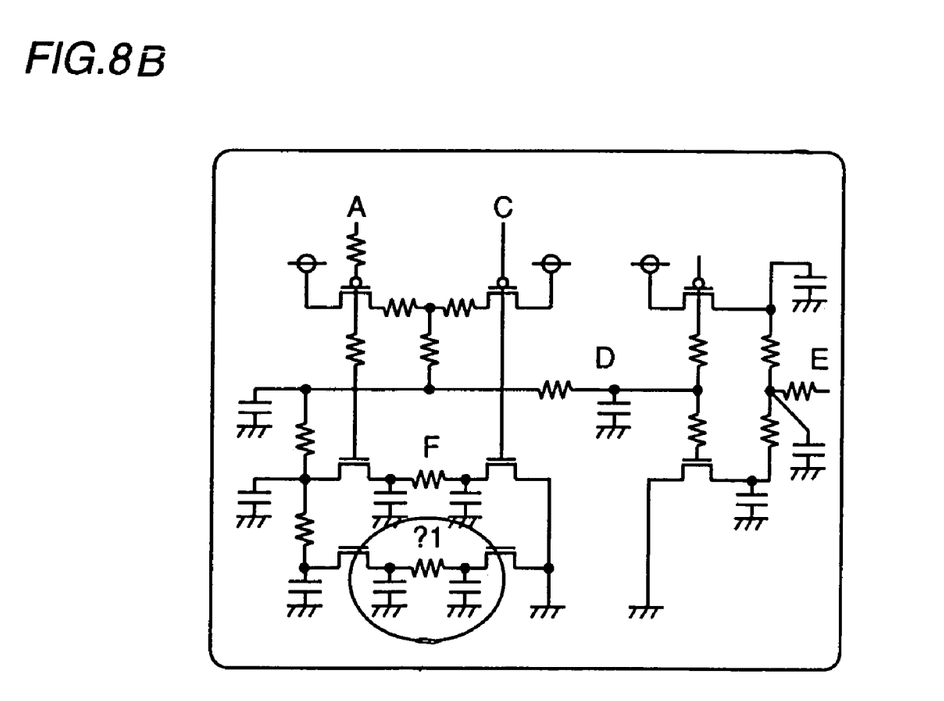

The process of S12 is described in detail in reference to FIG. 8A below. If the nodes in the layout pattern data c1 corresponding to the active nodes/non-active nodes extracted at pre-layout simulation are the internal nodes of ca2 of serially connected devices degenerated according to a predetermined standard and connected in parallel at a layout pattern verification, all of the internal nodes (internal node F and ?1 prior to degeneration) in the above described degenerated layout pattern data c1 are extracted (FIG. 8B).

Figure 9A:
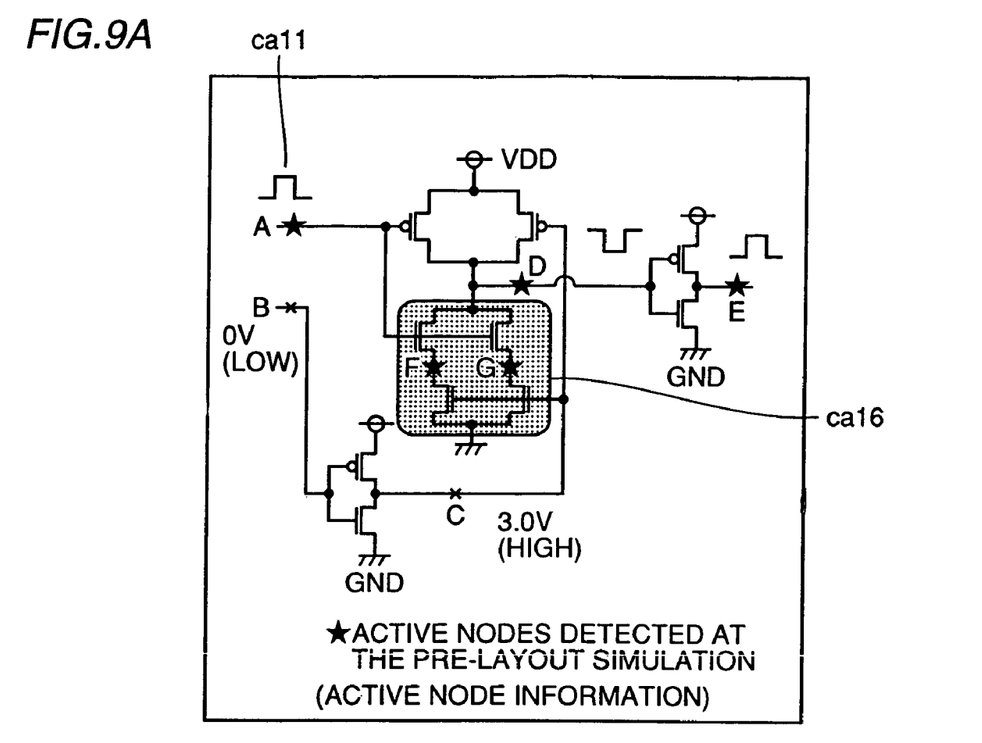
Figure 9B:
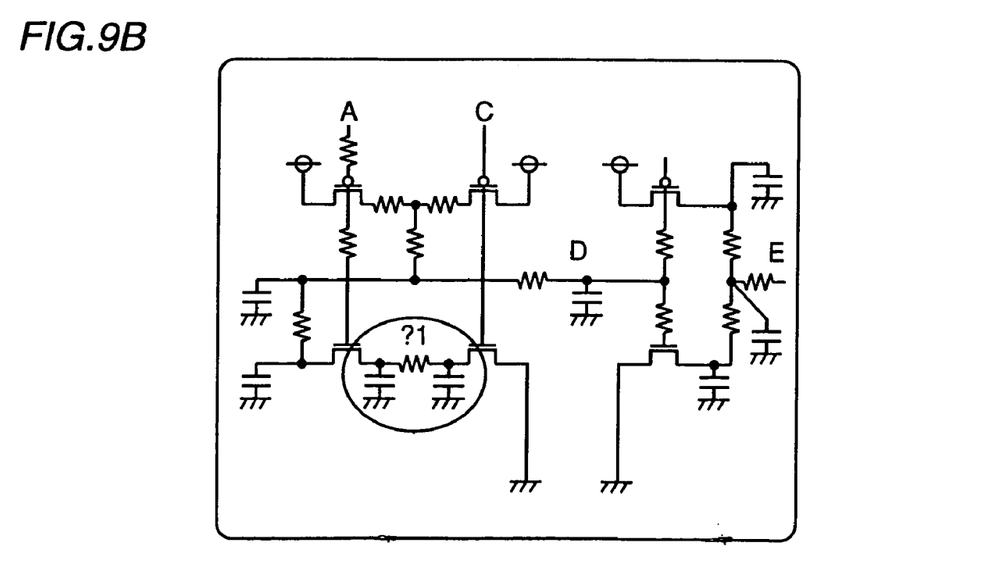

In addition, as shown in FIG. 9A, if nodes in the logic circuit diagram data corresponding to the active nodes/non-active nodes extracted at pre-layout simulation are the internal nodes of ca16 of serially connected devices degenerated according to a predetermined standard and connected in parallel at a layout pattern verification, the internal nodes ?1 in the layout pattern data corresponding to the internal nodes in the above described degenerated logic circuit diagram data are extracted (FIG. 9B).

After the process of S12, if the nodes in the layout pattern data corresponding to the active nodes/non-active nodes extracted at pre-layout simulation are the internal nodes of the serially connected devices degenerated according to a predetermined standard (serially connected elements or the like which are made to be a single element) at a layout pattern verification, all of the internal nodes in the degenerated layout pattern data (the internal nodes prior to degeneration) are extracted (S13).

In addition, at the same time, in S13, if the nodes in logic circuit diagram data corresponding to the above described active nodes/non-active nodes are the internal nodes of the serially connected devices degenerated according to the predetermined standard at a layout pattern verification, the internal nodes in the layout pattern data corresponding to the internal nodes in the logic circuit diagram are extracted.

Figure 10A:
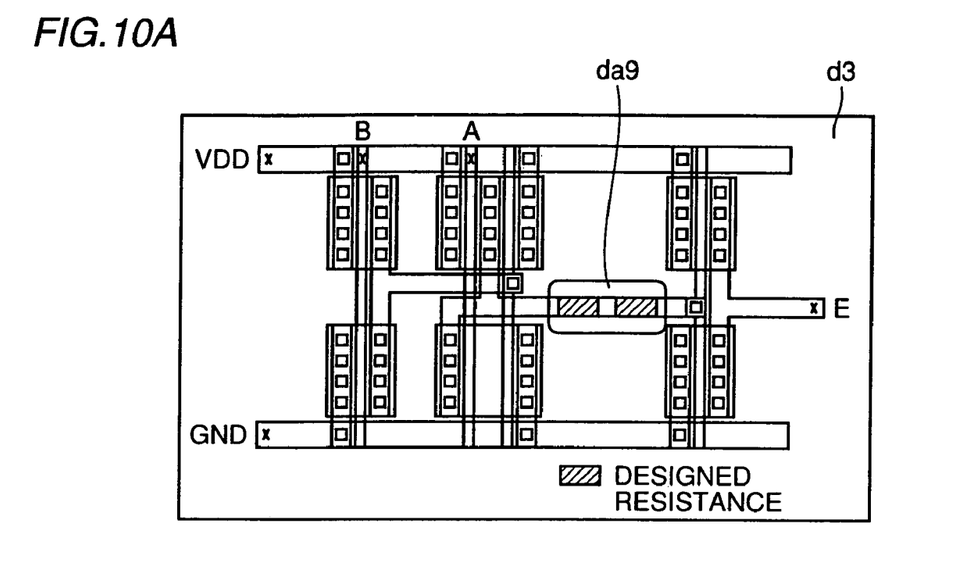
Figure 10B:
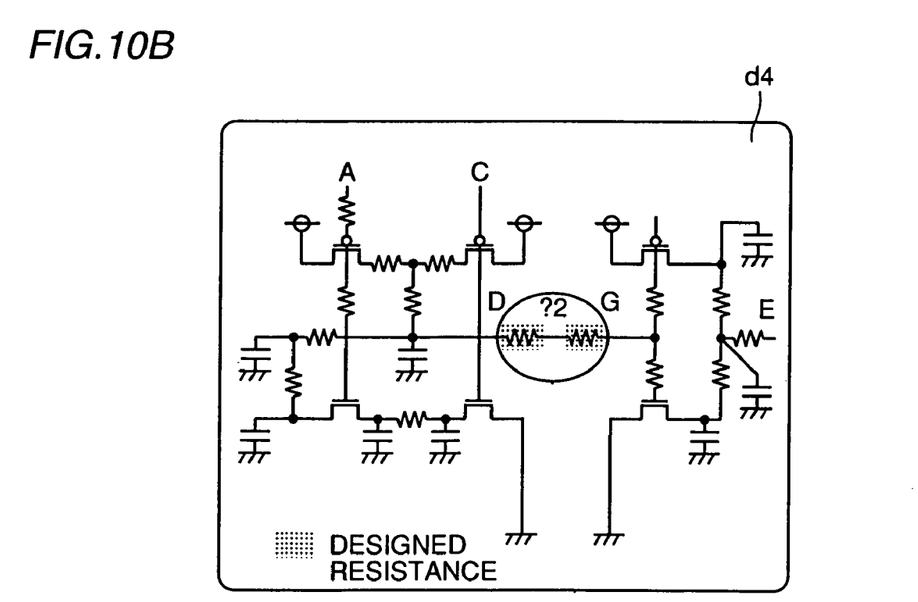

The process of S13 is described in detail below. The layout pattern data corresponding to the active nodes/non-active nodes extracted at pre-layout simulation are assumed to be there as shown in FIG. 10A. If the nodes in the layout pattern data d3 as shown in FIG. 10A are the internal nodes of the serially connected device da9 degenerated according to a predetermined standard at a layout pattern verification, as shown in FIG. 10B, the internal nodes in the above described degenerated layout pattern data (the internal nodes prior to degeneration) D, ?2 and G are extracted.

Figure 11:
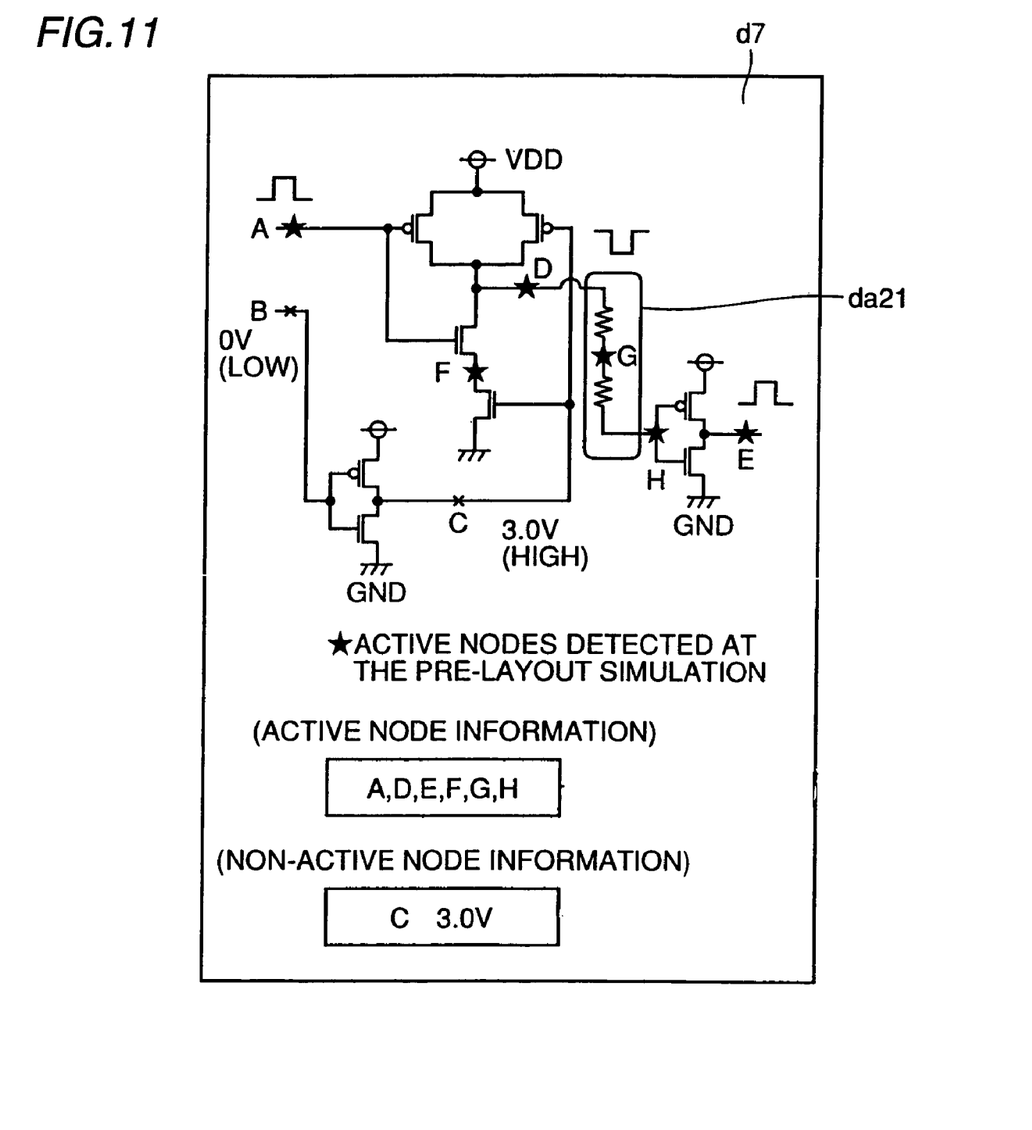

In addition, the logic circuit diagram data corresponding to the active nodes/non-active nodes extracted at pre-layout simulation are assumed to be there as shown in FIG. 11. If the nodes in the logic circuit diagram data d7 are the internal nodes of the serially connected devices da21 degenerated according to a predetermined standard, the internal node D in the layout pattern data corresponding to the internal nodes D and G in the above described degenerated logic circuit diagram data d7 is extracted.

Figure 12A:
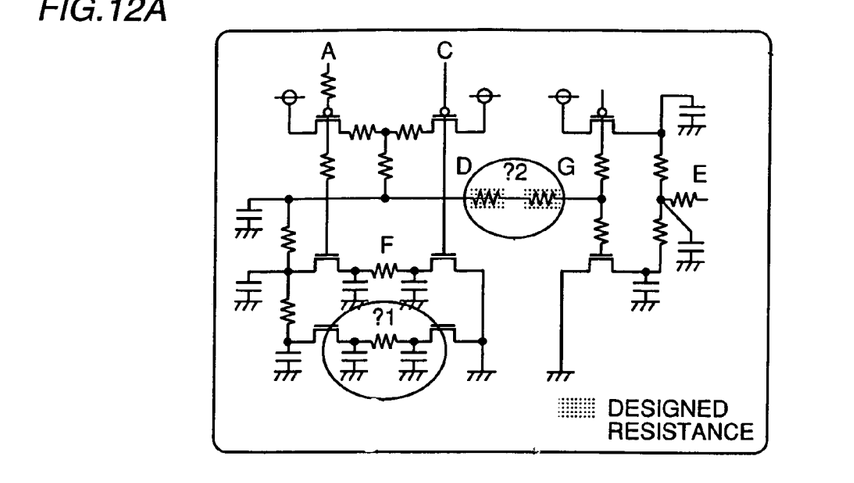
FIGS. 12A to 12D are diagrams for describing a pass selection type parasitic element extraction example and a degeneration example of parasitic element information.

As a result of S12 and S13 combined the internal nodes D, ?2, G, F and ?1 are extracted as shown in FIG. 12A.

Figure 12B:
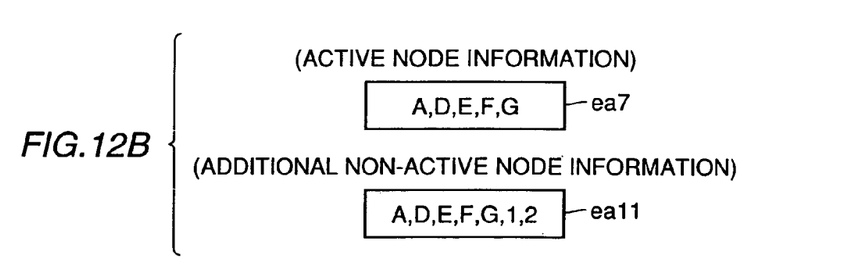

A net list with parasitic elements for the internal nodes extracted through the processes of S12 and S13 is converted to a net list with parasitic elements wherein the extraction precision of the parasitic elements are maintained while only the parasitic element information is degenerated (S14). That is to say, the internal nodes ?1 and ?2 are added to the active node information ea7 in FIG. 12B so that the active node information ea11 is formed.

Figure 12C:
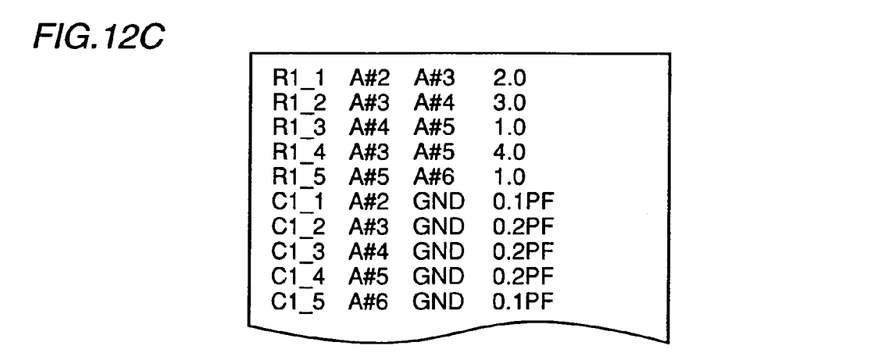

The result of the layout pattern verification in S2 and the active node information extracted in the pre-layout simulation of S11 are used to generate a pass selection type parasitic element extraction for active nodes within the layout pattern data and a net list (FIG. 12C) of a partial circuit with parasitic elements with respect to solely a device part (a partial circuit operated at the time of a pre-layout simulation) connected to the above described active nodes (S15).

Figure 12D:
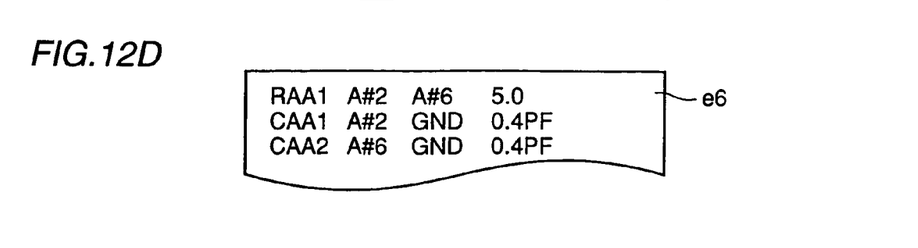

As shown in FIG. 12D, a net list e6, which degenerates only the parasitic element information included in a net list of a partial circuit with parasitic elements formed through the process of S15, is formed (S16).

After that, the net list e6 with parasitic elements generated in S16 is used to carry out a post layout simulation (S17). At the post layout simulation, the non-active node information ea8 as shown in FIG. 7D is used so that the potential of node C is fixed at 3.0 V.

As described above, according to the present embodiment, the target node selection of the parasitic element extraction is facilitated within the layout pattern data using the pre-layout simulation result. Accordingly, narrowing down of the post layout simulation target circuits, the parasitic element extraction following the layout pattern data, and degeneration of the parasitic element information while maintaining the extraction precision, can be implemented. In addition, parasitic element extraction processing time and the post layout simulation processing time using the above described parasitic element extraction result are shortened so that it becomes possible to carry out an effective back annotation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A back annotation apparatus including:
   a pre-layout simulation implementing part for carrying out a pre-layout simulation to detect nodes of which the potential changes when a predetermined signal is applied to a logic circuit during the pre-layout simulation;
   a layout pattern verification implementing part for implementing a predetermined layout pattern verification for layout patterns of said logical circuit;
   a parasitic element extraction part connected to said pre-layout simulation implementing part which extracts parasitic elements from said nodes detected during the pre-layout simulation;
   a net list generation part connected to said parasitic element extraction part for generating a net list which includes all the devices included in layout pattern data and parasitic elements extracted in said parasitic element extraction part; and
   a post layout simulation implementing part connected to said net list generation part for implementing a post layout simulation by using said net list.

2. A back annotation apparatus according to claim 1, wherein
   said pre-layout simulation implementing part includes:
   an active node detection part for detecting nodes of which the potential changes when a predetermined signal is applied to said logic circuit; and
   a non active node detection part for detecting nodes of which the potential does not change when said predetermined signal is applied to said logic circuit,
   said net list generation part includes a net list generation part with parasitic elements which is connected to said parasitic element extraction part and said layout pattern verification implementing part and which generates a net list including parasitic elements to the active nodes within said layout pattern data and devices connected to said active nodes,
   said post layout simulation implementing part includes a circuit which is connected to said net list generation part and said non active node detection part, which fixes the potential of said node, of which the potential does not change, at a predetermined potential and which implements a post layout simulation by using said net list.

3. A back annotation apparatus according to claim 2 further including:
   an internal node extraction part for extracting layout pattern data or nodes of the logic circuit diagram which is connected to said layout pattern verification implementing part and to which serially connected devices degenerated according to a predetermined standard at the time of layout pattern verification are connected in parallel; and
   a node information updating part for updating the detection result of the active node detection part and the non active node detection part based on the extraction result at said internal node extraction part, which is connected to said internal node extraction part, said active node detection part and said non active node detection part.

4. A back annotation apparatus according to claim 2 further including:
   an internal node extraction part for extracting layout pattern data or nodes of the logic circuit diagram which is connected to said layout pattern verification implementing part and wherein serially connected elements degenerated according to a predetermined standard at the time of layout pattern verification are made to be a single element; and
   a node information updating part for updating the detection result of the active node detection part and the non active node detection part based on the extraction result at said internal node extraction part, which is connected to said internal node extraction part, said active node detection part and said non active node detection part.

5. A back annotation apparatus according to claim 2 further including:
   a first internal node extraction part for extracting layout pattern data or nodes of the logic circuit diagram which is connected to said layout pattern verification implementing part and to which serially connected devices degenerated according to a predetermined standard at the time of layout pattern verification are connected in parallel;
   a second internal node extraction part for extracting layout pattern data or nodes of the logic circuit diagram which is connected to said layout pattern verification implementing part and wherein serially connected elements degenerated according to a predetermined standard at the time of layout pattern verification are made to be a single element;
   a node information updating part for updating the detection result of the active node detection part and the non active node detection part based on the extraction result at said first and said second internal node extraction parts, which is connected to said first internal node extraction part, said second internal node extraction part, said active node detection part and said non active node detection part; and
   a parasitic element information degenerating part for degenerating only the parasitic element information included in said net list which is connected to said net list generation part with parasitic elements.

6. A computer-implemented back annotation method including:
   the step of performing a pre-layout simulation to detect nodes of which the potential changes when a predetermined signal is applied to a logic circuit during the pre-layout simulation;
   the step of implementing a predetermined layout pattern verification with respect to a layout pattern of said logic circuit;
   the step of extracting parasitic elements from said nodes detected during the pre-layout simulation;
   the step of generation of a net list including all the devices included in layout pattern data and the parasitic elements extracted in said step of extracting parasitic elements; and
   the step of implementation of a post layout simulation by using said net list.

7. A back annotation method according to claim 6, wherein:
   said step of detection includes;

the step of detection of nodes of which the potential changes when said predetermined signal is applied to said logic circuit; and the step of detection of nodes of which the potential does not change when said predetermined signal is applied to said logic circuit, said step of generation includes the step of generation of a net list which includes parasitic elements on the active nodes within said layout pattern data and devices connected to said active nodes, and said step of implementation includes the step of fixing the potential of said nodes, of which the potential does not change, at a predetermined potential and implementing a post layout simulation by using said net list.

8. A back annotation method according to claim 7 further including:

the step of extraction of layout pattern data or nodes of a logic circuit diagram, wherein serially connected devices, which are degenerated according to a predetermined standard at the time of layout pattern verification, are connected in parallel; and the step of updating information with respect to said nodes of which the potential changes and said nodes of which the potential does not change based on the result of extraction of the nodes.

9. A back annotation method according to claim 7 further including:

the step of extraction of layout pattern data or nodes of a logic circuit diagram, wherein serially connected elements, which are degenerated according to a predetermined standard at the time of layout pattern verification, are made to be a single element; and the step of updating information with respect to said nodes of which the potential changes and said nodes of which the potential does not change based on the result of extraction of the nodes.

10. A back annotation method according to claim 7 further including:

the step of extraction of layout pattern data or nodes of a logic circuit diagram, wherein serially connected devices, which are degenerated according to a predetermined standard at the time of layout pattern verification, are connected in parallel;

the step of extraction of layout pattern data or nodes of a logic circuit diagram, wherein serially connected elements, which are degenerated according to a predetermined standard at the time of layout pattern verification, are made to be a single element;

the step of updating information with respect to said nodes of which the potential changes and said nodes of which the potential does not change based on the result of said extraction of the nodes; and the step of degeneration of only parasitic element information included in said net list.

* * * * *